United States Patent [19]

Ishii

[11] Patent Number: 4,733,221

[45] Date of Patent: Mar. 22, 1988

[54] A-D CONVERTER CIRCUIT

[75] Inventor: Takatoshi Ishii, Tokyo, Japan

[73] Assignee: ASCII Corporation, Tokyo, Japan

[21] Appl. No.: 874,110

[22] Filed: Jun. 13, 1986

[30] Foreign Application Priority Data

| Jun. 14, 1985 [JP] | Japan | 60-128057 |
| Sep. 10, 1985 [JP] | Japan | 60-198682 |
| Nov. 27, 1985 [JP] | Japan | 60-267026 |

[51] Int. Cl.$^4$ .................................................. H03M 1/20
[52] U.S. Cl. ....................... 340/347 AD; 340/347 DD
[58] Field of Search ................ 340/347 AD; 364/768, 364/769

[56] References Cited

U.S. PATENT DOCUMENTS

| 3,419,819 | 12/1968 | Murakami et al. | 340/347 AD |
| 3,696,400 | 10/1972 | Lang | 340/347 AD |
| 4,244,004 | 1/1981 | Yamada | 340/347 AD |

*Primary Examiner*—William M. Shoop, Jr.
*Assistant Examiner*—Richard K. Blum
*Attorney, Agent, or Firm*—Cushman, Darby & Cushman

[57] ABSTRACT

An inexpensive A-D converter circuit comprising a signal conversion circuit for converting an analog signal into a digital signal based on a reference voltage, in which the whole reference voltage is varied periodically, the output signal just ahead of the signal conversion circuit is held by an output buffer, and the output signal of the signal conversion circuit and the signal just ahead are added. Also, in the A-D converter circuit, after the above addition, a difference between two consecutive pieces of data of the output data of the signal conversion circuit is detected. When the data difference is within a given range, then the output of the above addition is selected, while for the data difference exceeding the given range double the above output is selected. Further, to be able to increase the number of gradations without expanding the capacity of a display memory, parallel data stored in the display memory for image display purposes are respectively received and held by a latch whenever they are output from the display memory, and the next data output from the display memory and the data output from the latch are added.

9 Claims, 15 Drawing Figures

| INPUT | | | OUTPUT | |
|---|---|---|---|---|
| C3 | C2 | C1 | D1 | D0 |
| 0 | 0 | 0 | 0 | 0 |
| 0 | 0 | 1 | 0 | 1 |
| 0 | 1 | 1 | 1 | 0 |
| 1 | 1 | 1 | 1 | 1 |

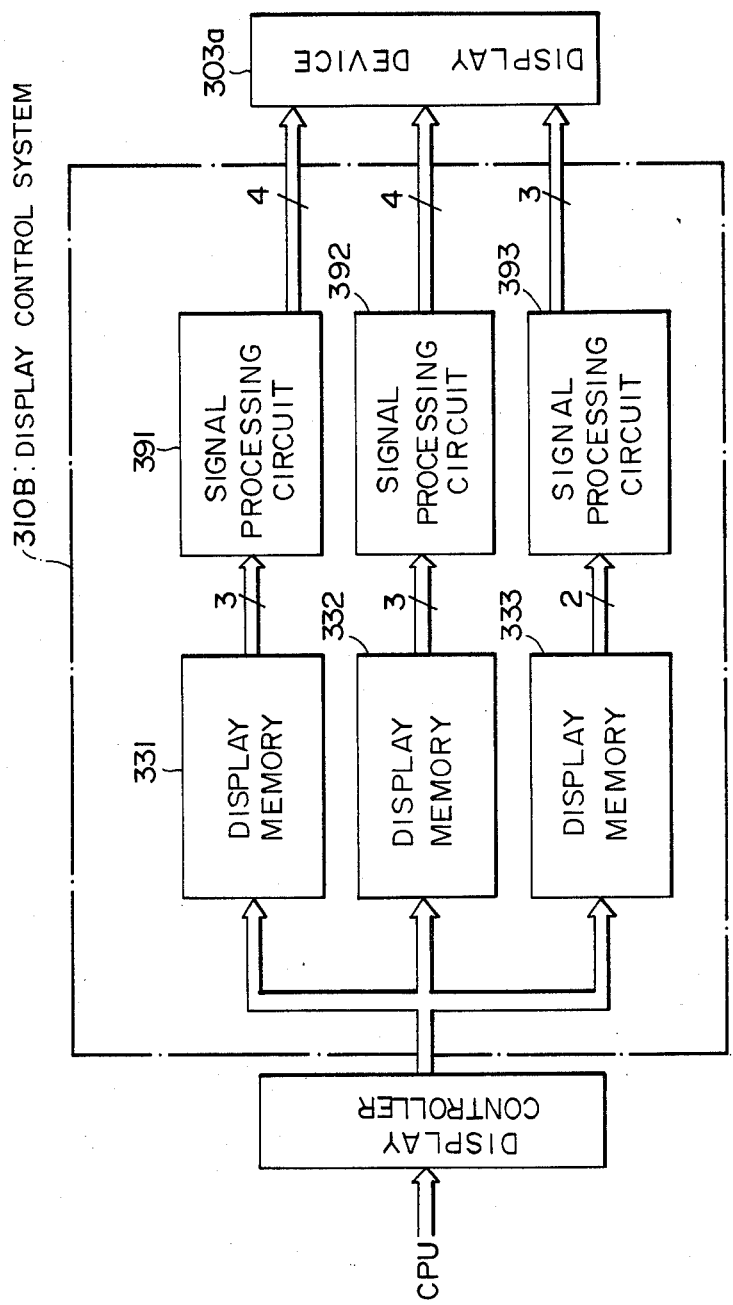

A-D CONVERTER CIRCUIT

BACKGROUND OF THE INVENTION

1. Field of the Invention

The present invention relates to an A-D converter circuit which converts analog signals into digital signals.

2. Description of the Prior Art

An A-D converter circuit is used to convert analog signals into digital signals and, conventionally, there are present various kinds of circuit configurations for such A-D converter circuits. Also, there exist various methods in which image informatio is A-D converted, the A-D converted image information is stored into a display memory, and the stored digital data is modified so as to create an image. In this case, from the viewpoint of versatility, a low-cost A-D converter circuit is required.

When used to load the image information, from the viewpoint of actual requests for resolution and the like, an A-D converter circuit capable of outputting 5 bits is desirable. However, the A-D converter circuit capable of outputting 5 bits presents a problem that it is much more expensive than an A-D converter circuit capable of outputting 4 bits. The reason why the circuit of 5-bits output is desired is as follows:

In FIG. 4, there is shown a circuit diagram of a prior art A-D converter circuit which is adapted to output 2 bits. This 2-bit output A-D converter circuit 10 comprises 3 analog comparison circuits ACP 1~ACP 3 and 4 division resistances R 1~R 4. The outputs of the analog comparison circuits ACP 1~ACP 3 are coded by an encoder 11, and the coded data are latched by a latch 11a. FIG. 5 illustrates a table which shows the relationship between the input and output of the above-mentioned encoder 11.

Also, the A-D converter circuit capable of outputting 4 bits comprises 15 analog comparison circuits and 16 division resistances, while the A-D converter circuit of 5-bits output requires 31 analog comparison circuits and 32 division resistances. Thus, in the 5-bit outputting A-D converter circuit, the number of the division resistances and analog comparison circuits is substantially increased, and at the same time the division resistances require a very high accuracy and the analog comparison circuits require a very high sensitivity. When the sensitivity is enhanced, noise must not be allowed to get mixed in or occur, requiring an effective noise-preventive countermeasure. Also, since the encoder has 31 inputs, the number of gates of the encoder are increased accordingly. For these reasons, the 5-bit output A-D converter circuit becomes very expensive.

On the other hand, in a computer system, a display control system displaying on a CRT or the like is arranged such that, after the display data to be displayed is once written into and stored in a display memory, it reads out the data from the display memory and displays it on the CRT. In this case, in order to enhance a pixel density or realize color display, it is necessary to increase the capacity of the above-mentioned display memory. In the color display, the more kinds of colors (color gradations) are used, the more the capacity of the display memory must be increased. Also, in case of a monochrome display, as the number of display gradations is increased, the capacity of the display memory is increased, which is a problem to be solved.

SUMMARY OF THE INVENTION

The present invention aims at eliminating the drawbacks found in the above-mentioned prior art circuits.

It is an object of the invention to provide an inexpensive A-D converter circuit.

It is another object of the invention to provide a display control system which is capable of increasing the number of color gradations without increasing the capacity of a display memory.

In order to make an A-D converter circuit inexpensive, according to one aspect of the invention, there is provided a signal converter circuit which converts an analog signal into a digital signal based on a reference voltage, the reference voltage being wholly and periodically fluctuated, the next output signal just ahead of the signal converter circuit being held in an output buffer, and the current output signal of the signal converter circuit and the next output signal just ahead thereof are added by an adder circuit. Also, there are provided a signal variation amount detection circuit which detects a difference between two consecutive data among the output data of the signal converter circuit after such addition and a signal select circuit which selects the output of the adder circuit when the data difference is equal to or less than a predetermined value and which selects double the output data when the data difference is greater than the predetermined value.

In order to be able to increase the number of gradations without expanding the capacity of the display memory, according to another aspect of the invention, parallel data are stored in a display and memory for the purpose of image display, when each of the parallel data is output from the display memory, it is loaded into and held in a latch, the next data to be output from the display memory and the current data being output from the latch being added by an adder circuit, thereby increasing the number of bits equivalently.

Also, in the invention, a difference between the data being output from the display memory and the data being output from the latch is detected, and the output of the adder circuit is selected when the difference detected is equal to or less than a predetermined value, and double the data being output from the display memory is selected when the difference is greater than the predetermined value.

The above and further objects and novel features of the invention will more fully appear from the following detailed description when the same is read in connection with the accompanying drawings.

BRIEF DESCRIPTION OF THE DRAWINGS

FIG. 15 is a block diagram of a modification of the sixth embodiment.

DETAILED DESCRIPTION OF PREFERRED EMBODIMENTS OF THE INVENTION

Figure 1:
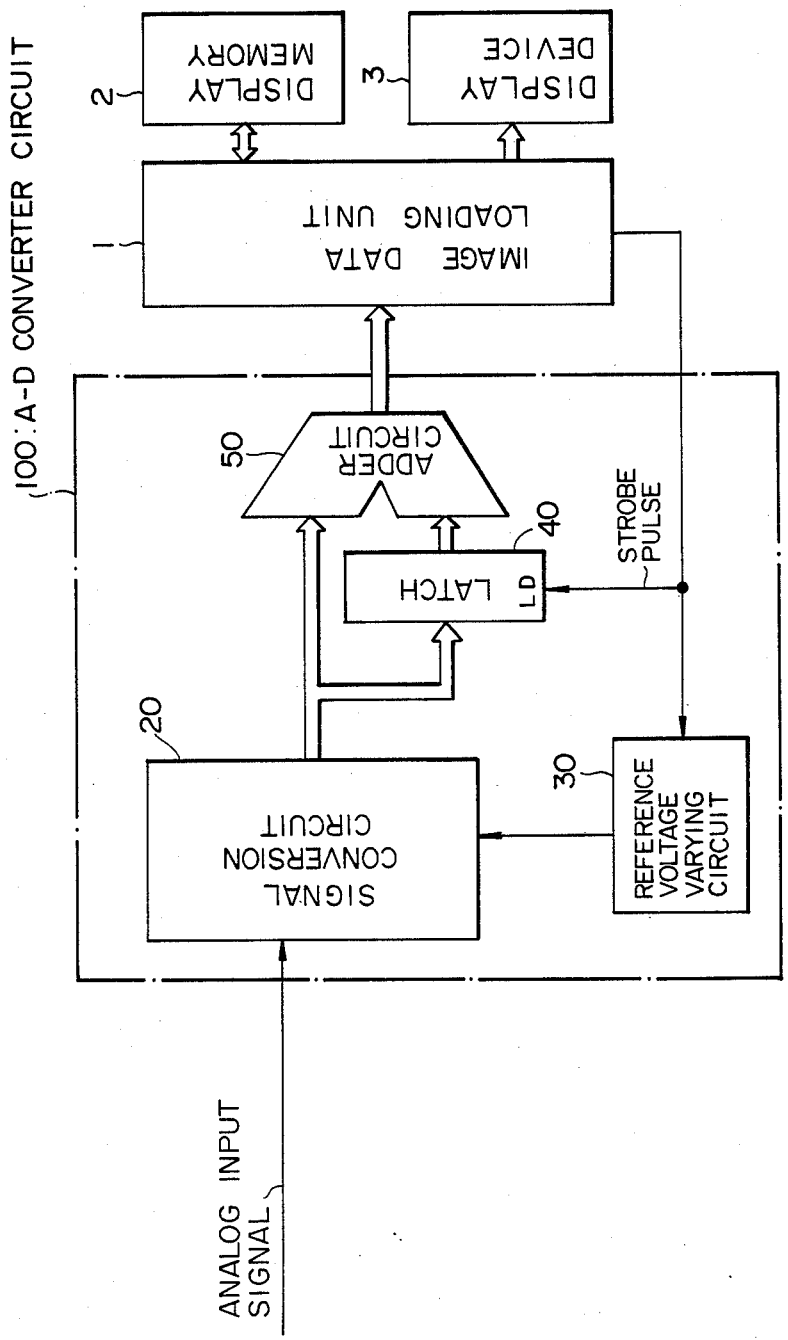
FIG. 1 is a block diagram of a first embodiment of the invention.

Referring first to FIG. 1, there is illustrated a block diagram of a first embodiment of the invention.

Figure 2:
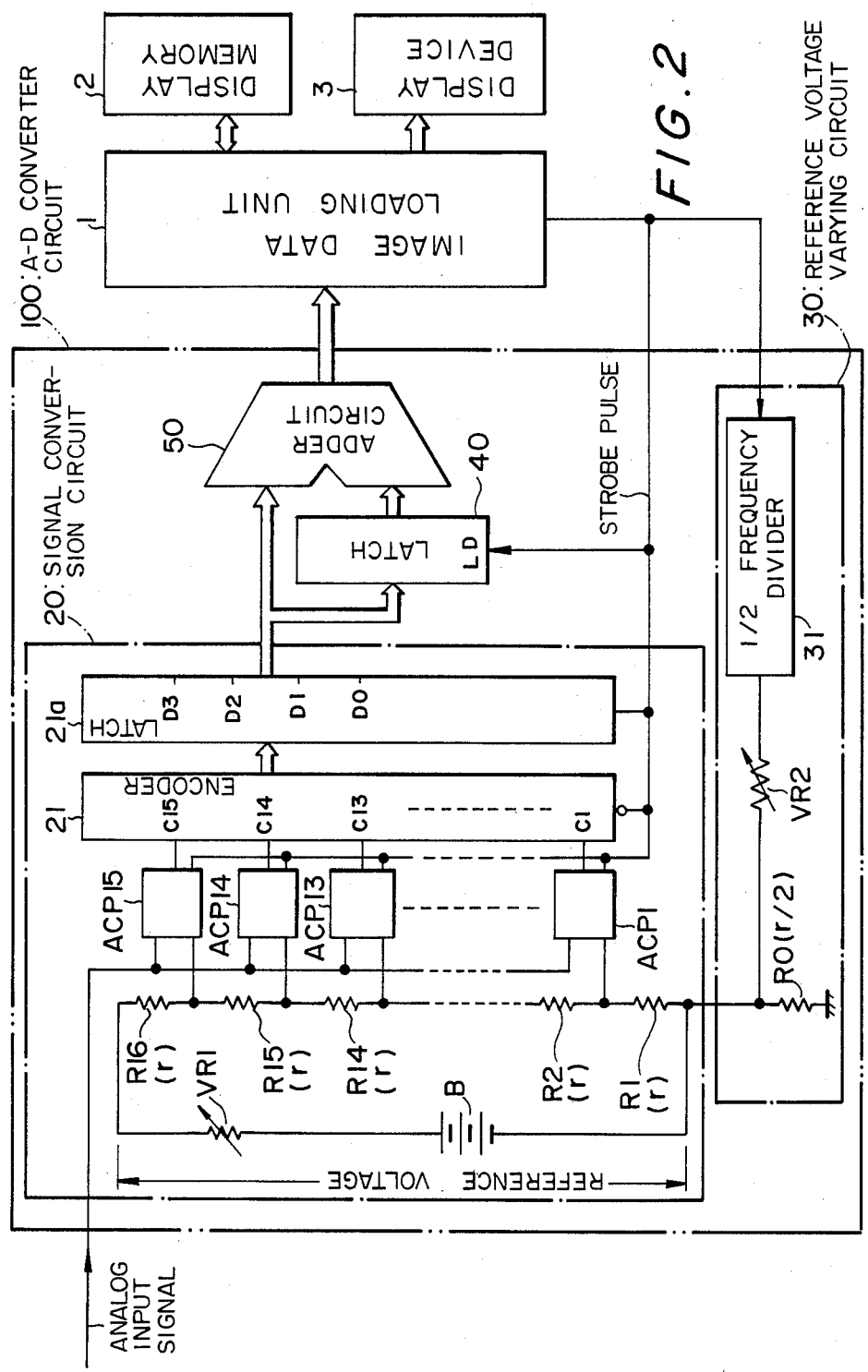
FIG. 2 is a block diagram to show the main portions of the first embodiment in more detail.

In this figure, A-D Converter Circuit 100 comprises a signal converter circuit 20, a reference voltage fluctuation circuit 30, a latch buffer 40, and an adder circuit 50. Signal Converter Circuit 20 is adapted to convert an analog input signal into a digital signal of a given number of bits in accordance with a reference voltage. The details of this signal converter circuit 20 are shown in FIG. 2. Reference Voltage Fluctuation Circuit 30 is a circuit to fluctuate the whole reference voltage of Signal Converter Circuit 20 each time it is sampled. Latch 40 is a buffer to take in the output signal output just ahead in Signal Converter Circuit 20. Adder Circuit 50 is a circuit which adds the output signal of Signal Converter Circuit 20 and the output signal of Latch 40 and also outputs a signal of bits 1 greater than the number of the output bits of Signal Converter Circuit 20.

In FIG. 2, there is illustrated a circuit diagram which shows A-D Converter Circuit 100 in more detail.

Signal Converter Circuit 20 is adapted to output 4 bits of digital data in accordance with an analog input signal, that is, it is similar to a conventional 4-bit outputting A-D converter circuit. Signal Converter Circuit 20 also includes 16 serially connected resistances R 1~R 16 (each having an equal resistance value r) so as to be able to obtain 16 kinds of voltages at regular intervals in accordance with the reference voltage. There are provided Analog Comparison Circuits ACP 1~ACP 15 which are respectively used to compare the voltages divided from the reference voltage with the analog input signals. There is also arranged an encoder 21 which is dedicated to generating 4 bits of outputs D 0~D 3 in accordance with the output signals of the respective analog comparison circuits ACP 1~ACP 15. Also, the output data of Encoder 21 is latched by Latch 21a. In FIG. 2, reference VR 1 designates a variable resistance for regulating the reference voltage.

Reference Voltage Fluctuation Circuit 30 comprises a resistance R0 connected in series with the serial circuit of Resistances R 1~R 16, a variable resistance VR2, and a ½ frequency divider 31. Resistance R0 has a resistance value about one-half the resistance value r, and ½ Frequency Divider 31 is adapted to divide into a half the frequency of a strobe pulse transmitted from Image Data Loading Unit 1 and also to output a signal having a pulse width of about 50%.

Image Data Loading Unit 1 is used to take in image data which is the output signal of A-D Converter Circuit 100, and signals from Image Data Loading Unit 1 are transmitted to Display Memory 2 as well as Display Device 3.

Next, the operation of the above-mentioned embodiment will be explained.

Figure 3:
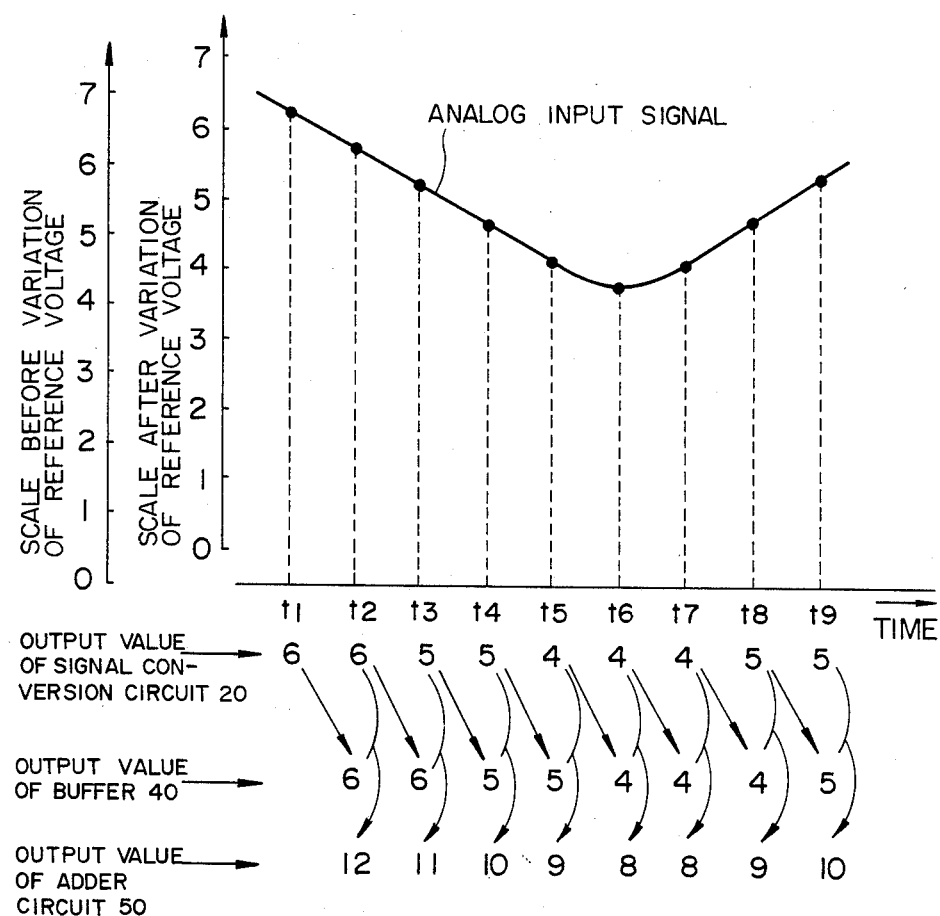
FIG. 3 is a table of the relationship between analog inputs and data outputs in an A-D converter circuit employed in the first embodiment.
Figures 4, 5:
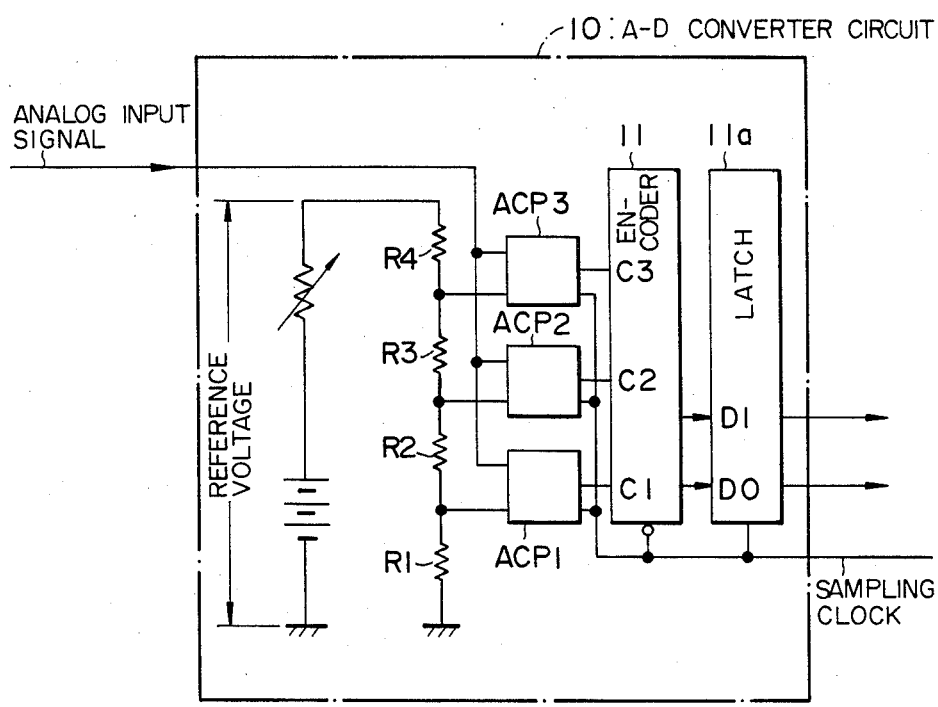
FIG. 4 is a circuit diagram of a conventional A-D converter circuit.
FIG. 5 is a table to show the relationship between the inputs and outputs of the above-mentioned conventional A-D converter circuit.

An example of the operation of A-D Converter Circuit 100 is illustrated in FIG. 3, which is a table to show how the analog inputs and digital outputs of Circuit 100 correspond to each other.

In the above-mentioned embodiment, let us consider that the analog signal input is sent to A-D Converter Circuit 100. In this case, first, at a time t1 a signal of "1" has been delivered, with the result that voltage is appearing on the two terminals of Resistance R0. Therefore, a signal is output from Signal Converter Circuit 20 according to "a scale after variation of reference voltage" shown in FIG. 3. That is, in the above-mentioned embodiment, a signal of "6" is output at time t1, and it is then loaded into Latch 40.

At the next timing (that is, Time t2), a signal of "0" is transmitted from ½ Frequency Divider 31, with the result that 0 voltage will be applied on both terminals of Resistance R0. In this case, an analog input signal is converted according to "a scale before variation of reference voltage" shown in FIG. 3. Thus, the output of Signal Converter Circuit 20 becomes "6".

Here, the output value "6" of Signal Converter Circuit 20 and the output value "6" of Latch 40 at Time t2 are added by Adder Circuit 50. As a result of this, the output value of Adder Circuit 50 becomes "12". This output of Adder Circuit 50 becomes the output of A-D Converter Circuit 100. Also, after completion of such addition, a strobe pulse is applied from Image Data Loading Unit 1 to Latch 40, and the then output data of Signal Converter Circuit 20 is loaded into Latch 40.

At the next time t3, a signal of "1" is transmitted from Frequency Divider 31, causing voltage to appear on both terminals of Resistance R0. The, the then analog input signal is converted according to the "scale after variation of reference voltage". Therefore, in this case, a signal of "5" is output from Signal Converter Circuit 20. And, the output value "5" of Signal Converter Circuit 20 and the output value "6" of Latch 40 are added by Adder Circuit 50, with the result that a signal of "11" is output. Also, Latch 40 then receives a strobe pulse and takes in the output value "5" of Signal Converter Circuit 20.

In this way, the reference voltage in Signal Converter Circuit 20 is varied at each sampling to convert the analog signal into a signal of a digital value in Signal Converter Circuit 20, the output values of Signal Converter Circuit 20 and Latch 40 are added at each sampling, and just after then Latch 40 takes in the output value of Signal Converter Circuit 20. These series of operations are sequentially repeated. As a result of this, as shown in FIG. 3, the output value of Adder Circuit 50 provides the data that is 1 bit greater than the output value of Signal Converter Circuit 20.

Also, a cycle for which the reference voltage in Reference Voltage Fluctuation Circuit 30 is fluctuated or varied is double the sample loading cycle in Signal Converter Circuit 20. Alternatively, as Signal Converter Circuit 20, another circuit of other bit amounts than 4 bits may be employed. In the above-mentioned embodiment, A-D Converter Circuit 100 is connected to Image Data Loading Unit 1, but this circuit may also be applied to other uses than the above-mentioned image data loading.

Figure 6:
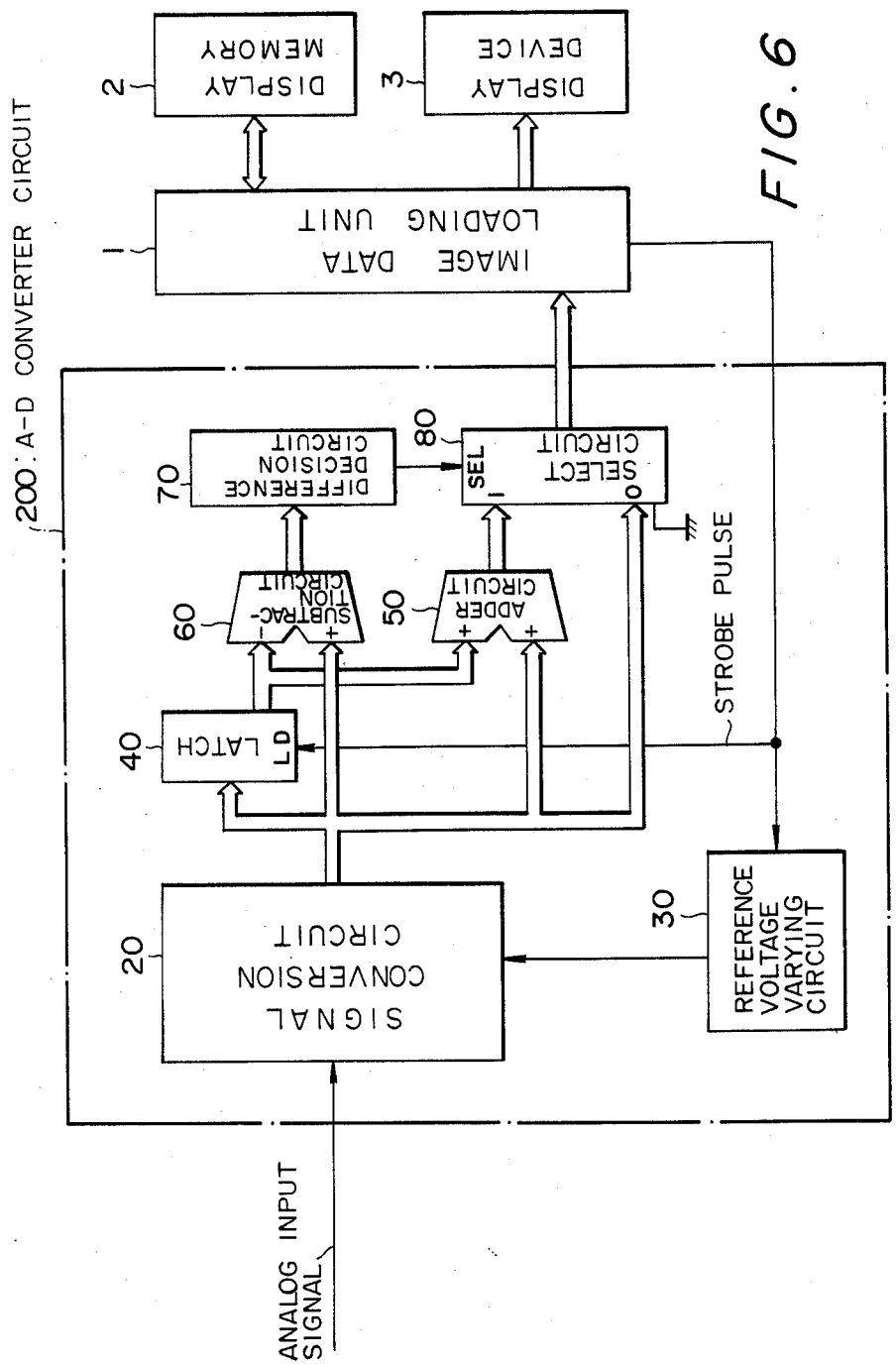
FIG. 6 is a block diagram of a second embodiment of the invention.

Referring now to FIG. 6, there is illustrated a second embodiment of the invention in its block form. In this figure, the same parts that are shown in FIGS. 1 and 2 are given the same references thereof and the description of the same is omitted here. This applies to the following figures as well.

The second embodiment in FIG. 6 is different from the above-mentioned first embodiment in FIG. 1 in that it further includes a subtraction circuit 60, a difference decision circuit 70 and a select circuit 80. Subtraction Circuit 60 is a kind of signal variation amount detecting means which is adapted to detect a difference between two consecutive pieces of data among the output data of Signal Converter Circuit 20. Difference Decision Circuit 70 decides whether the difference computed by Subtraction Circuit 60 is between "1~+1 and, when it is between −1~+1, outputs "1". Select Circuit 80 is adapted to select the signal of Adder Circuit 50 when the output of Subtraction Circuit 60 is found between −1~+1, and also to double and output the output of Signal Converter Circuit 20 when the output of Subtraction Circuit 60 is less than −1 or more than +1. At the time of the output being doubled, the lowest-order bit inputs "0". Difference Decision Circuit 70 and Select Circuit 80 thus cooperate to form a kind of signal select means which is adapted to select the output of Adder Circuit 50 when the above-mentioned data difference is found to be within a predetermined value and also to select double the output of Adder Circuit 50 when the data difference is found exceeding the predetermined value.

Figure 9:
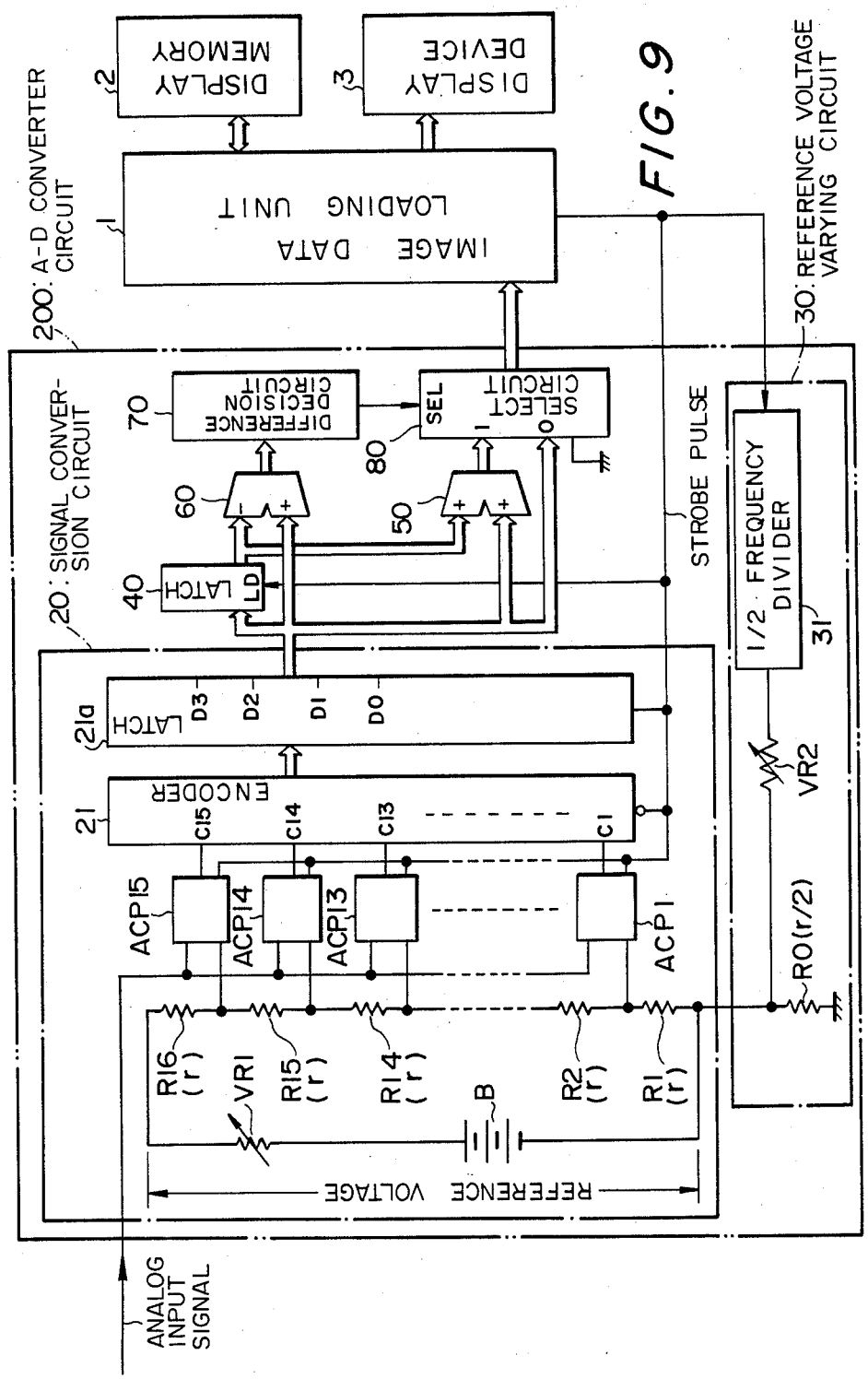
FIG. 9 is a block diagram to show the main portions of the second embodiment of the invention in more detail.

In FIG. 9, there is shown a block diagram to illustrate the embodiment of FIG. 6 in more detail.

Figure 10:
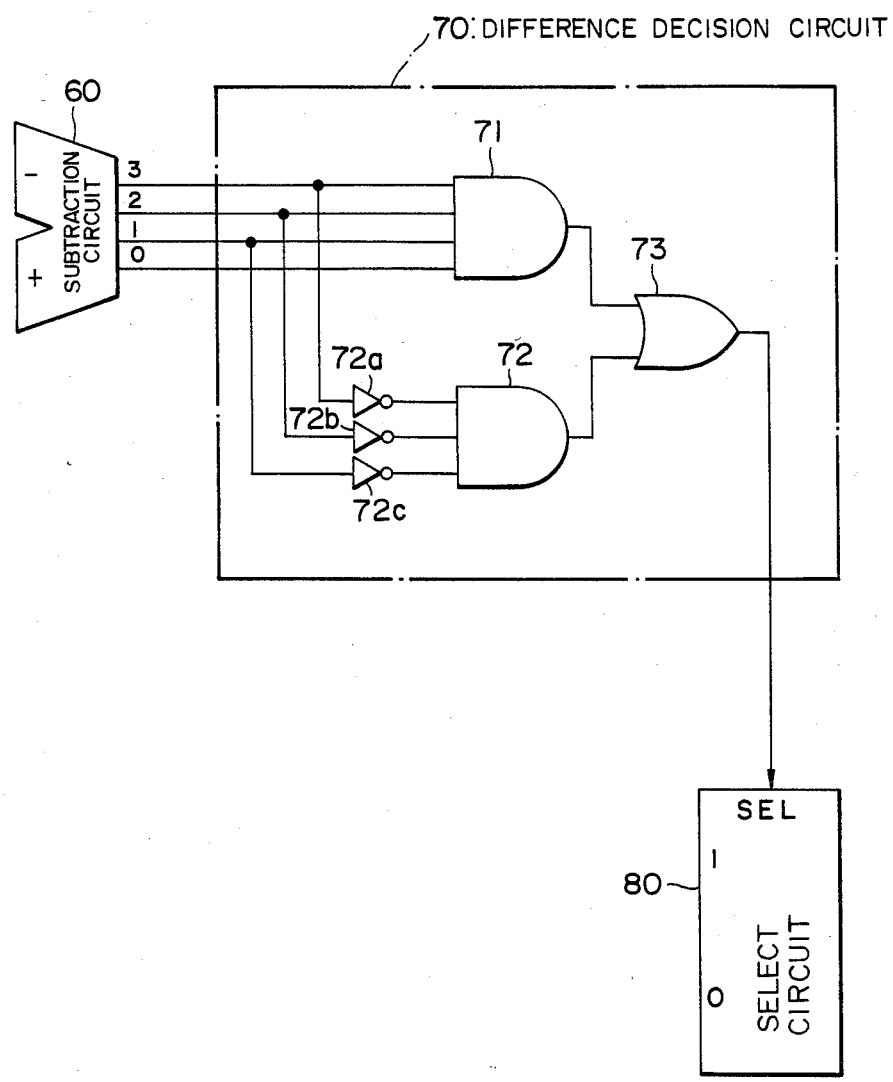
FIG. 10 is a circuit diagram of a logic circuit employed in the second embodiment as a detection circuit.

In FIG. 10, there is shown a circuit diagram to illustrate an example of Difference Decision Circuit 70 as shown. Difference Decision Circuit 70 comprises AND Circuits 71, 72, Inverters 72a, 72b, 72c, and OR Circuit 73. AND Circuit 71 is adapted to output "1" when the output signal of Subtraction Circuit 60 isI "1 1 1 1" (=−1). AND Circuit 72 is adapted to invert and AND the higher 3 bits of the output signal of Subtraction Circuit 60 and to output "1" when the inverted and ANDed signal is "0 0 0 1" (=1) or "0 0 0 0" (=0). In the above-mentioned embodiment, although Signal Converter Circuit 20 is adapted to output 4 bits, in order to output other bit numbers than 4 bits, the numbers of inputs of AND Circuits 71, 72 may be varied according to the number of bits required.

Next, the operation of the above-mentioned embodiment will be discussed.

Figure 11:
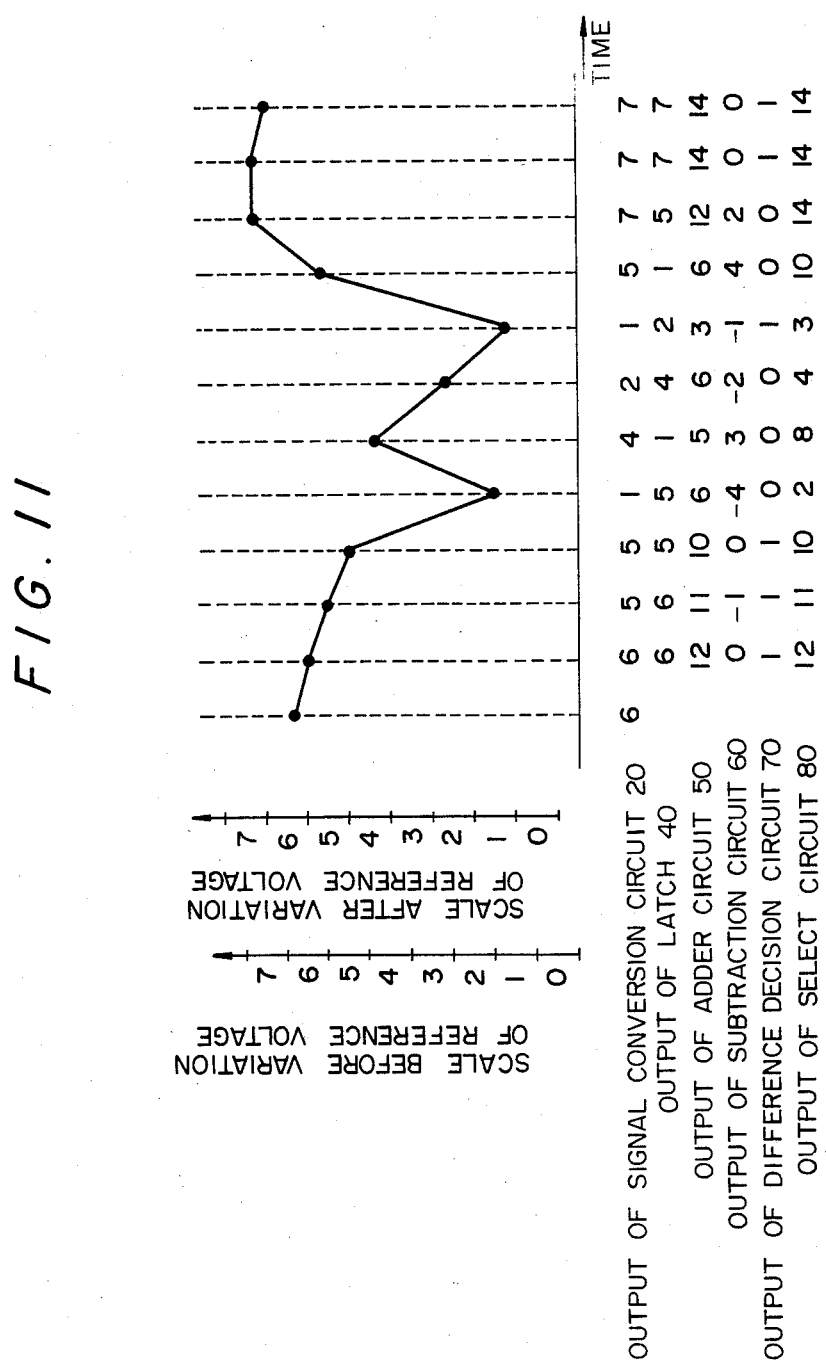
FIG. 11 is a table to show the relationship between the analog inputs and data outputs in the second embodiment.

FIG. 11 is a table to show how the analog inputs and data outputs correspond to each other in the above-mentioned embodiment. Similarly to the previously described first embodiment of the invention, the outut data of Signal Converter Circuit 20 are sequentially latched by Latch 40 and the data just ahead and the current data are added.

The output data of Signal Converter Circuit 20 and the latched data thereof are sent to Subtraction Circuit 60, where a difference between the data just ahead and the current data is found. Whether the difference is between −1~+1 is decided by Difference Decision Circuit 70. When the difference is found between −1~+1, then the output signal of Difference Decision Circuit 70 becomes "1". This is partly because AND Circuit 71 outputs "1" for the difference of −1 and partly because AND Circuit 72 outputs "1" for the difference of 0 or +1. And, if Difference Detection Circuit 70 outputs "1", then the output signal, as it is, becomes the output signal of A-D Converter Circuit 200, while if "0" is output from Difference Detection Circuit 70, then the signal output from Signal Converter Circuit 20 is doubled, providing the output of A-D Converter Circuit 200.

Here, if the output signal of Difference Detection or Decision Circuit 70 is smaller, then the addition of the data just ahead and the current data exerts no evil effects due to averaging and, therefore, a digital signal having bits greater by 1 bit)that is, a digital signal of 5 bits) can be output. Also, if the output signal of Difference Detection Circuit 70 is greater, then since the current data is doubled, the addition of such current data and the data just ahead can produce no evil effects. Therefore, a digital signal of bits greater by 1 bit (or, 5 bits) can be output in this case as well.

Figure 12:
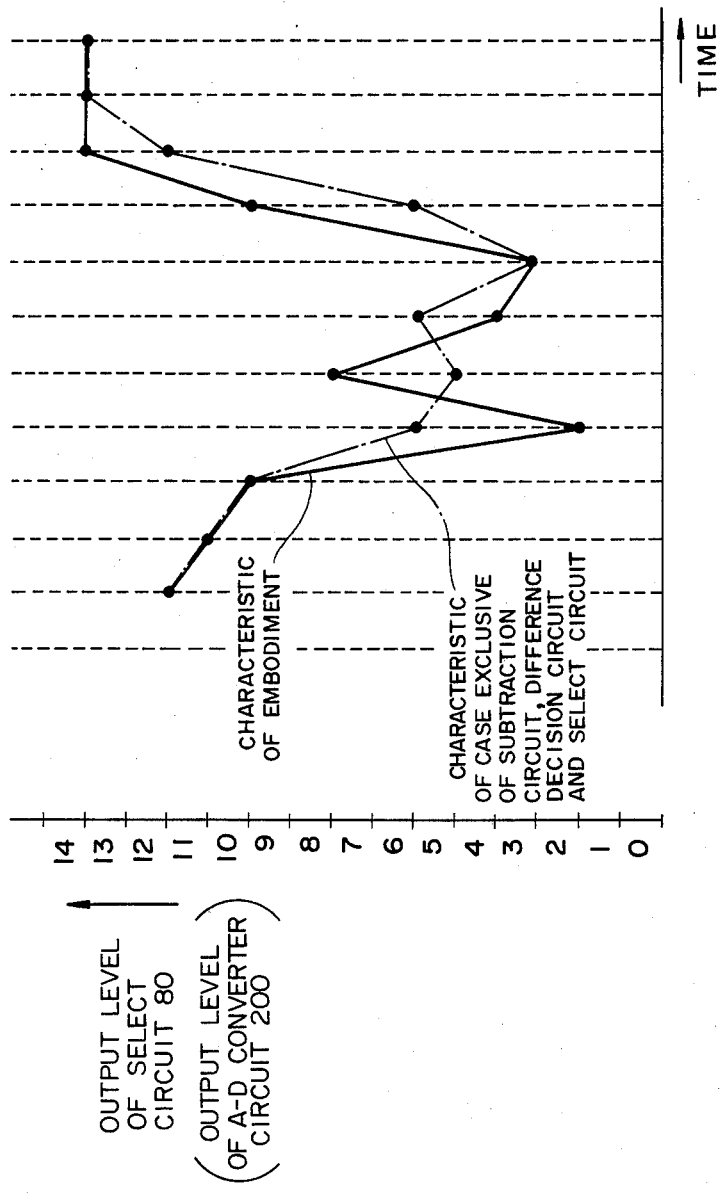
FIG. 12 is a table to show the results obtained when the case of a subtraction circuit and a detection circuit are present and a case of these two circuits are absent are compared with each other in FIG. 11.

In FIG. 12, there is shown a table to illustrate the results obtained when a casing including a subtraction circuit, a difference detection circuit and a select circuit is compared with another case where these three circuits are not present.

One characteristic shown by a solid line is obtained in the above-mentioned embodiment (that is, the case including the above-mentioned three circuits) and the other characteristic shown by a one-dot chained line is obtained in the latter case excluding the three circuits therefrom. As can be seen from this table, if the subtraction circuit, difference detection circuit and select circuit are absent, when the data from Signal Converter Circuit 20 varies suddenly, the data is output with the amount of variation thereof being reduced. Therefore, an instantaneous response property (a property to respond to sudden variations) is worsened.

In the above-mentioned embodiment, although the signal of Adder Circuit 50 can be selected only when the output of Subtraction Circuit 70 is in the range of −1~+1, the signal from Adder Circuit 50 may be selected for other ranges than the above-mentioned range as well.

Figure 7:
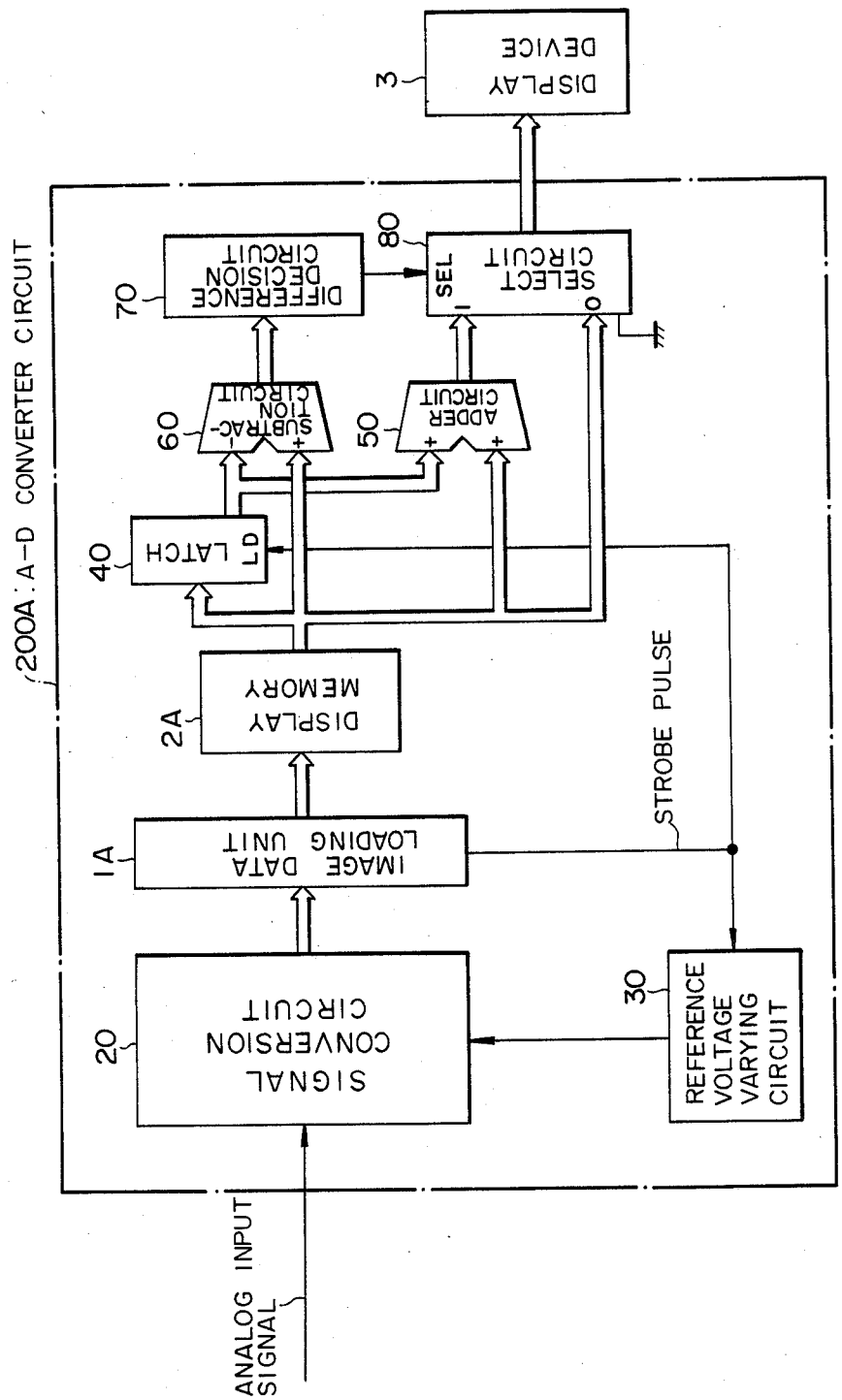
FIG. 7 is a block diagram of a third embodiment of the invention.
Figure 8:
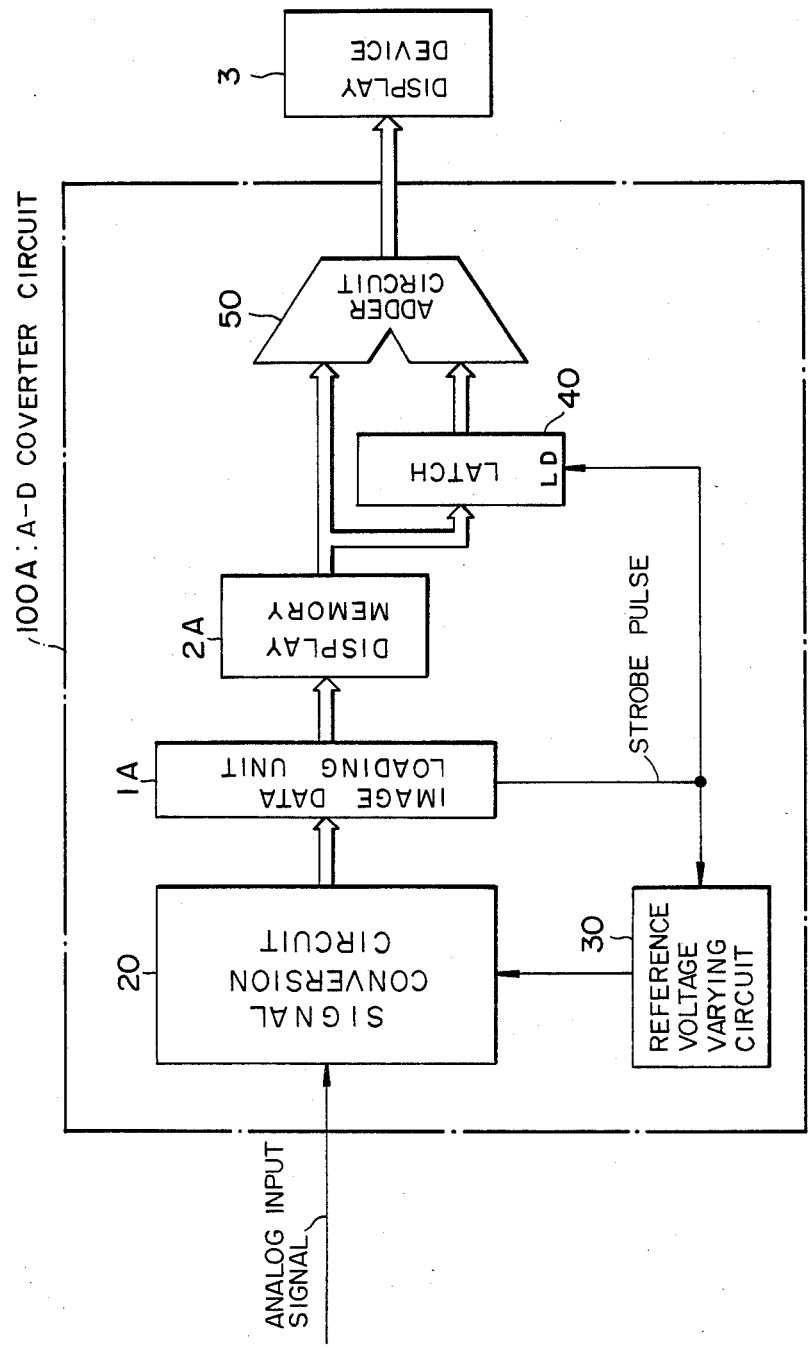
FIG. 8 is a block diagram of a fourth embodiment of the invention.

Referring now to FIG. 7, there is illustrated a third embodiment of the invention in its block form.

In the third embodiment, Image Data Loading Unit 1A and Display Memory 2A are included in A-D Converter Circuit 200 employed in the second embodiment shown in FIG. 6. Image Data Loading Unit 1A is similar to Image Data Loading Unit 1, and Display Memory 2A is also similar to Display Memory 2.

In this arrangement, similar effects can be obtained as in the embodiment in FIG. 6 and, in addition, since it has only to store the data of 4 bits, Display Memory 1A is advantageous over the first embodiment of the invention in which the data of 5 bits must be stored in that the memory capacity thereof can be saved by 20%.

Referring next to Fix. 8, there is shown a block diagram of a fourth embodiment of the invention.

In the fourth embodiment, an image data loading unit 1A and a display memory 2A are included in A-D Converter Circuit 100 shown in FIG. 1. Image Data Loading Unit 1A is similar to Image Data Loading Unit 1, and Display Memory 2A is also similar to Display Memory 2.

This arrangement provides similar effects as in the arrangement shown in FIG. 1. Also, since it has only to store the data of 4 bits, Display Memory 1A is advantageous in that it can reduce its memory capacity by 20% when compared with the embodiment shown in FIG. 1 requiring the storage of the data of 5 bits.

Figure 13:
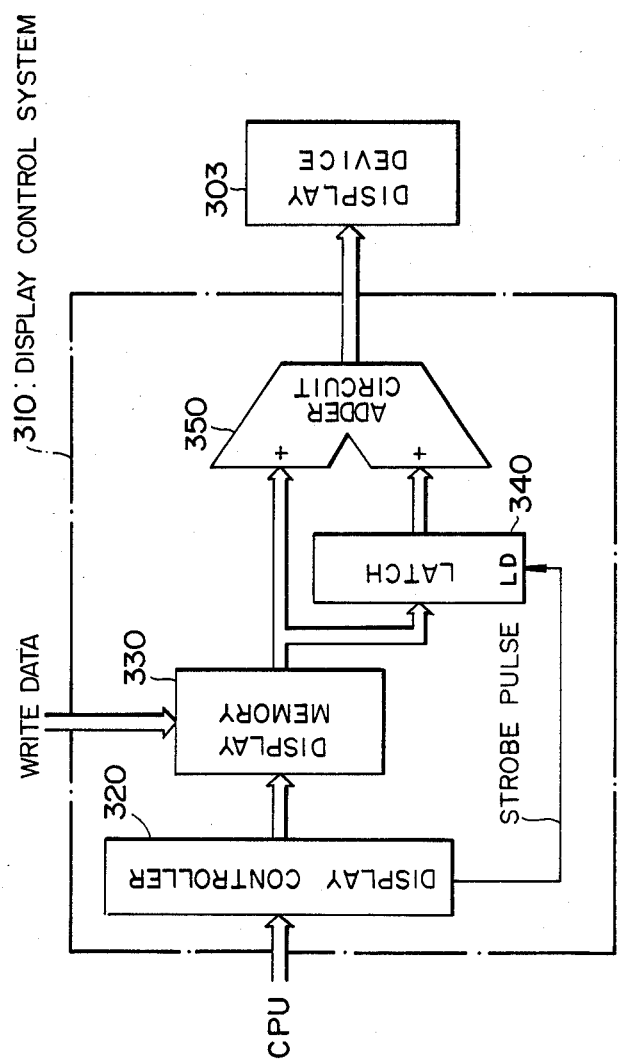
FIG. 13 is a block diagram of a fifth embodiment of the invention.

Referring now to FIG. 13, there is shown a block diagram of a fifth embodiment of the invention.

The fifth embodiment comprises a display control system 310 which includes a display controller 320, a display memory 330, a latch 340 and an adder circuit 350. Display Controller 320 is adapted to transmit a strobe signal to Latch 340 each time Display Memory 330 outputs 1 piece of parallel data, while Display Memory 330 is adapted to store the parallel data (write data) that consists of a predetermined number of bits. Display Memory 330 is usually arranged to have a capacity capable of displaying 1 screen simultaneously. Latch 340 is used to receive and hold the parallel data output from Display Memory 330 each time it is output, while Adder Circuit 350 is dedicated to adding the data output from Display Memory 330 and the data output from Latch 340.

In this figure, there is illustrated a display device 303, which may be a CRT or the like for displaying an image.

Next, we will describe the operation of the above-mentioned fifth embodiment.

If, for example, Display Memory 330 outputs the data "6", "6", "5", "5", --- --- ---(decimal digit) sequentially, each of the output data consists of 3 bits. If, the above data are then latched by Latch 340, the output data of Display Memory 330 and the output data of Latch 340 are then added by Adder Circuit 350. That is, at first, the output "6" of Display Memory 330 and the output "6" of Latch 340 are added, with the result that "12" is output by Adder Circuit 350. Then, the output "5" of Display Memory 330 and the output "6" of Latch 340 are added, with the result that "11" is output from Adder Circuit 350. Next, the output "5" of Display Memory 330 and the output "5" of Latch 340 are added, with the result that "10" is output from Adder Circuit 350.

In the above-mentioned case, while the output data of Display Memory 330 each consists of 3 bits, each of the output data of Adder Circuit 350, or, "12", "11", "10" (decimal digit) is composed of 4 bits. Therefore, the number of gradations can be increased by 1 bit without increasing the capacity of Display Memory 330.

Figure 14:
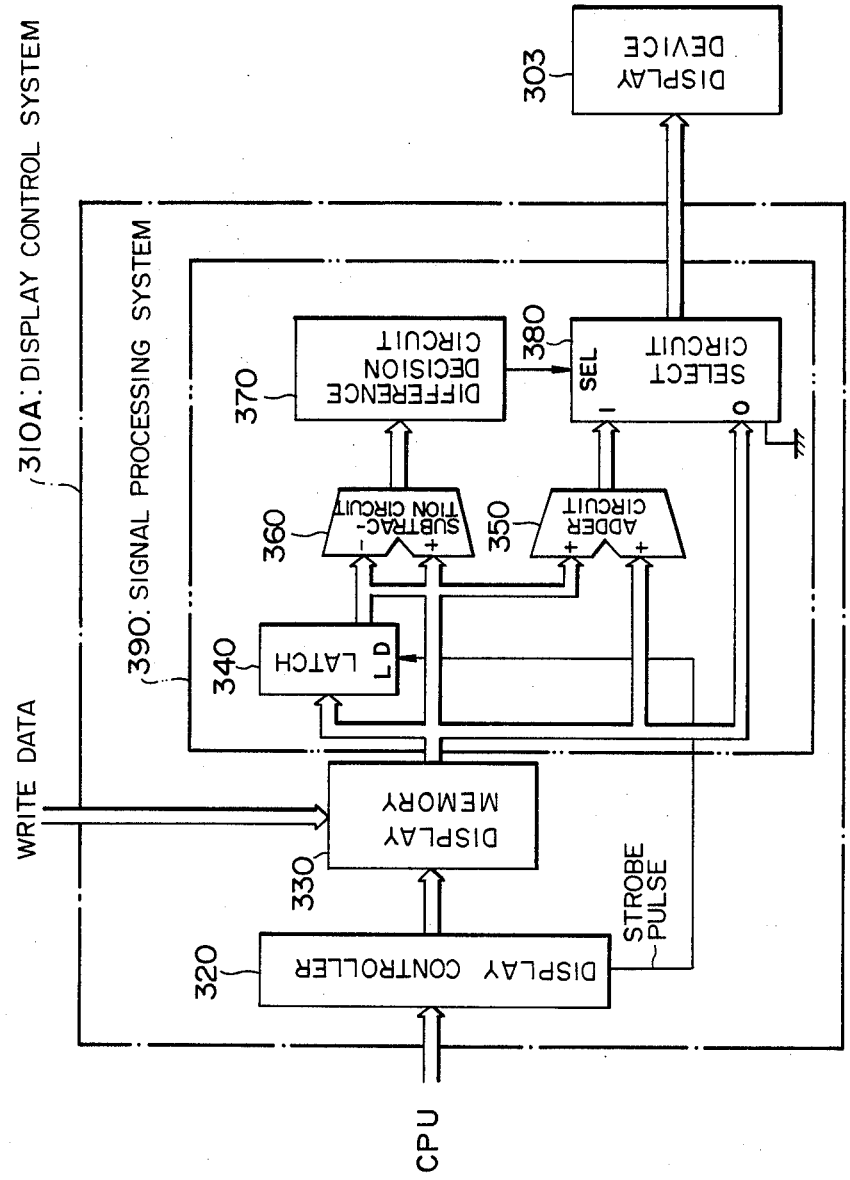
FIG. 14 is a block diagram of a sixth embodiment of the invention.

Now, in FIG. 14, there is shown a block diagram of a sixth embodiment of the invention.

In this figure, the same parts as shown in FIG. 13 are then given the same designations and the explanation thereof is omitted here.

The sixth embodiment is improved in its response property when the output data of Display Memory 330 varies greatly, and is different from the above-mentioned fifth embodiment in that it further includes Subtraction Circuit 360, Difference Decision Circuit 370 and Select Circuit 380. Also, in the sixth embodiment, there is provided a signal processing system 390 which comprises Subtraction Circuit 360, Difference Decision Circuit 370, Select Circuit 380, Latch 340 and Adder Circuit 350. Subtraction Circuit 360 is a kind of signal variation amount detecting means to detect a difference between the data output from Display Memory 330 and the data output from Latch 340. Difference Decision Circuit 370 is a circuit to decide whether the difference computed by Subtraction Circuit 360 is in the range of $-1 \sim +1$, and to output "1" only when the difference is in the range of $-1 \sim +1$. Select Circuit 380 is adapted to select the signal of Adder Circuit 350 when the output of Subtraction Circuit 360 is in the range of $-1 \sim +1$, and also to double the output of Display Memory 330, before it is output, when the output of Subtraction Circuit 350 is smaller than $-1$ or greater than $+1$. At the time of the output being doubled, the lowest bit inputs "0". Thus, Difference Decision Circuit 370 and Select Circuit 380 cooperate in forming signal select means which selects the output of Adder Circuit 350 when the above-mentioned data difference is within a predetermined value and also selects double the data output from Display Memory 330 when the data difference is greater than the predetermined value.

Difference Decision Circuit 370 shown in FIG. 14 is identical with the difference decision circuit shown in FIG. 10. Also, the operation of the embodiment shown in FIG. 14 is similar to the operation discussed before with reference to FIGS. 11 and 12. That is, in order to explain the operation of the embodiment in FIG. 14, the output of Signal Conversion Circuit 20, the output of Latch 40, the output of Adder Circuit 50, the output of Subtraction Circuit 60, the output of Difference Decision Circuit 70 and the output of Select Circuit 80 in FIG. 11 may be replaced by the output of Display Memory 330, the output of Latch 340, the output of Adder Circuit 350, the output of Subtraction Circuit 360, the output of Difference Decision Circuit 370 and the output of Select Circuit 380, respectively.

Further in FIG. 12, if the vertical line is used to denote the output of Select Circuit 380, the solid line stands for the characteristic of the sixth embodiment shown in FIG. 14, while the one-dot chained line represents the characteristic of the fifth embodiment (that is, an embodiment in which the subtraction circuit, difference decision circuit and select circuit are not employed) shown in FIG. 13.

Referring now to FIG. 15, there is shown a block diagram of a seventh embodiment of the invention which is a modification of the sixth embodiment of FIG. 14.

This embodiment provides a display control system 310B which is suitable for a color display. In this embodiment, Display Memories 331, 332, 333 are employed in place of Display Memory 330, while instead of Signal Processing Circuit 390 there are provided Signal Processing Circuits 391, 392, 393.

Display Memories 331, 332, 333 are basically similar to Display Memory 330 shown in FIG. 14, while Display Memories 331, 332 are respectively a memory capable of outputting 3 bits (a memory adapted to store image information for 3 screens,) and Display Memory 333 is a memory capable of outputting 2 bits (a memory adapted to store image information for 2 screens). Signal Processing Circuits 391, 392, 393 are all similar to Signal Processing Circuit 390 shown in FIG. 14.

The seventh embodiment is a display control system which is used to perform a color display. For example, a G (green) signal is processed by Display Memory 331 and Signal Processing Circuit 391, an R (red) signal is processed by Display Memory 332 and Signal Processing Circuit 392, and a B (blue) signal is processed by Display Memory 333 and Signal Processing Circuit 393. Then, when the thus processed signals are transmitted to Display Device 303a, then Display Device 303a displays a color image. In this case, while the total of the image information to be held in and stored by Display Memories 331, 332 and 333 is 8 bits, the information to be supplied to Display Device 303a corresponds to 11 bits, so that the kinds of colors (color gradations) can be increased.

As mentioned above, the seventh embodiment in FIG. 15 is a modification of the embodiment of FIG. 14. Similarly, the embodiment of FIG. 13 may be modified to provide the same arrangement as with the seventh embodiment. That is, there may be provided 3 display memories 330 and 3 signal processing circuits each consisting of Latch 340 and Adder Circuit 350 only.

Also, the invention may consist of signal conversion means for converting an analog input signal into a digital signal of a given number of bits in accordance with reference voltage and reference voltage varying means for varying the reference voltage of the signal conversion means each time it is sampled. In this case, an operation to add two successive bits of data output from the signal conversion means may be performed in a delayed manner or may be performed by another device. Further, the value of Resistor VR2 is set such that, when "1" is output from ½ Frequency Divider 31, the half voltage of the voltage across Resistor R1 appears across Resistor R0.

What is claimed is:

1. An A-D converter circuit comprising:
   signal conversion means for converting an analog input signal into a digital signal of a predetermined number of bits based on a reference voltage; and
   reference voltage varying means for varying said reference voltage of said signal conversion means each time said reference voltage is sampled by approximately half of the minimum amount of voltage detected by the signal conversion means.

2. An A-D converter circuit comprising:
   signal conversion means for converting an analog input signal into a digital signal of a predetermined number of bits based on a reference voltage;
   reference voltage varying means for varying said reference voltage of said signal conversion means each time said reference voltage is sampled by approximately half of the minimum amount of voltage detected by the signal conversion means;
   buffer means for receiving and holding the output signal of said signal conversion means each time said output signal is sampled, and
   an adder circuit for adding two consecutive pieces of data of the output data of said signal conversion means, characterized in that a digital signal is output, said digital signal consisting of a number of bits 1 bit greater than said predetermined number of bits.

3. The A-D converter circuit as defined in claim 2, wherein the cycle of said reference voltage variation in said reference voltage varying means is double the cycle of sampling/loading actions in said signal conversion means.

4. An A-D converter circuit comprising:
   signal conversion means for converting an analog input signal into a digital signal of a predetermined number of bits based on a reference voltage;
   reference voltage varying means for varying said reference voltage of said signal conversion means each time said reference voltage is sampled by approximately half of the minimum amount of voltage detected by the signal conversion means;
   latch means for receiving and holding the output signal of said signal conversion means each time said output signal is sampled;
   an adder circuit for adding two consecutive pieces of data of the output data of said signal conversion means;
   signal variation amount detecting means for detecting the degree of a difference between said two consecutive pieces of data of said output data of said signal conversion means; and
   signal select means for selecting the output of said adder circuit when said data difference is within a pretermined range and selecting double the most recently outputted data when said data difference is outside said predetermined range, characterized in that a digital signal is output, said digital signal consisting of a number of bits 1 bit greater than said predetermined number of bits.

5. The A-D converter circuit as defined in claim 4, wherein the cycle of said reference voltage variation in said reference voltage varying means is double the cycle of sampling/loading actions in said signal conversion means.

6. An A-D converter circuit comprising:
   signal conversion means for converting an analog picture information input signal into a digital signal of a predetermined number of bits based on a reference voltage;
   reference voltage varying means for varying said reference voltage of said signal conversion means each time said reference voltage is sampled by approximately half of the minimum amount of voltage detected by the signal conversion means;
   latch means for receiving and holding the output signal of said signal conversion means each time said output signal is sampled;
   an adder circuit for adding two consecutive pieces of data of the output data of said signal conversion means; and
   memory means interposed between said signal conversion means and latch means for memorizing the converted picture information input signal,
   characterized in that a digital signal is output, said digital signal consisting of a number of bits 1 bit greater than said predetermined number of bits.

7. An A-D converter circuit comprising:
   signal conversion means for converting an analog input signal into a digital signal of a predetermined number of bits based on a reference voltage;
   reference voltage varying means for varying said reference voltage of said signal conversion means each time said reference voltage is sampled by approximately half of the minimum amount of voltage detected by the signal conversion means;
   latch means for receiving and holding the output signal of said signal conversion means each time said output signal is sampled;
   an adder circuit for adding two consecutive pieces of data of the output data of said signal conversion means;
   signal variation amount detecting means for detecting the degree of a difference between said consecutive pieces of data of said output data of said signal conversion means;
   signal select means for selecting the output of said adder circuit when said data difference is within a predetermined range and selecting double the most recently outputted data when said data difference is outside said predetermined range; and memory means interposed between said signal conversion means and said latch means for memorizing the converted input signal, characterized in that a digital signal is output, said digital signal consisting of a number of bits 1 bit greater than said predetermined number of bits.

8. A display control system comprising:
a display memory for storing parallel data each consisting of a predetermined number of bits;
latch means for receiving and holding each of said parallel data output from said display memory; and
an adder circuit for adding said data output from said display memory and data output from said latch means and for outputting a digital signal consisting of a number of bits 1 bit greater than said predetermined number of bits.

9. A display control system comprising:
a display memory for storing parallel data each consisting of a predetermined number of bits;
latch means for receiving and holding each of said parallel data output from said display memory;
an adder circuit for adding said data output from said display memory and data output from said latch means;
signal variation amount detecting means for detecting a difference between said data output from said display memory and said data output from said latch means; and
signal select means for selecting the output of said adder circuit when said data difference is within a predetermined range and selecting double said data from said display memory when said difference is outside said predetermined range to output a digital signal consisting of a number of bits 1 bit greater than said predetermined number of bits.

* * * * *